United States Patent
Kuehlwein et al.

(10) Patent No.: US 6,696,896 B2
(45) Date of Patent: Feb. 24, 2004

(54) METHOD FOR IMPLEMENTING HIGH FREQUENCY PROGRAMMABLE POLES AND ZEROS IN DISK DRIVE PREAMPLIFIERS

(75) Inventors: Jeremy Kuehlwein, Woodbury, MN (US); Craig M. Brannon, Maplewood, MN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/924,884

(22) Filed: Aug. 8, 2001

(65) Prior Publication Data

US 2003/0030496 A1 Feb. 13, 2003

(51) Int. Cl.[7] ................................................. H03F 3/04
(52) U.S. Cl. ........................ 330/305; 330/292; 327/359; 360/46
(58) Field of Search ................................ 330/252, 292, 330/305; 360/46, 67, 68; 327/359

(56) References Cited

U.S. PATENT DOCUMENTS

| 3,643,184 | A | | 2/1972 | D'Alessandro |
| 4,050,023 | A | | 9/1977 | Edgar |
| 4,458,212 | A | | 7/1984 | Brehmer et al. |
| 4,634,986 | A | | 1/1987 | Brookshier |
| 5,406,220 | A | | 4/1995 | Jones, III et al. |
| 5,581,495 | A | | 12/1996 | Adkins et al. |
| 5,633,765 | A | | 5/1997 | Lin et al. |
| 5,642,079 | A | | 6/1997 | Whiteside |
| 5,673,003 | A | * | 9/1997 | Zocher ........................ 330/305 |
| 5,760,641 | A | * | 6/1998 | Granger-Jones et al. .... 327/553 |
| 6,342,813 | B1 | * | 1/2002 | Imbornone et al. ......... 330/254 |

* cited by examiner

*Primary Examiner*—Henry Choe
(74) *Attorney, Agent, or Firm*—W. Daniel Swayze, Jr.; W. James Brady; Frederick J. Telecky, Jr.

(57) ABSTRACT

A pole and zero circuit for changing the position of a pole, or a zero, of an amplifier including a capacitor to change the position of the pole or zero for the amplifier, a first current path for the capacitor, a variable impedance device in the first current path to connect the capacitor to the amplifier, and a current source to control the impedance of the variable impedance device.

16 Claims, 5 Drawing Sheets

METHOD FOR IMPLEMENTING HIGH FREQUENCY PROGRAMMABLE POLES AND ZEROS IN DISK DRIVE PREAMPLIFIERS

FIELD OF THE INVENTION

The present invention generally relates to amplifier circuits and more particularly to amplifier circuits that relate to magnetic storage systems.

BACKGROUND OF THE INVENTION

The trend in the data storage industry is to continuously increase the data rate at which information is read from magnetic storage surfaces such as disk drives. Designers are developing high performance disk drives which tend to have magnetic domains positioned close together on the magnetic storage media, creating a high density of data recording. Additionally, these drives have greater rotation rates than lower performance drives, resulting in higher data rates. Higher data rates require faster voltage transitions at the input to the channel circuitry used to read data from the disk surface. Faster voltage transitions produce higher frequency components in the voltage input signal, thereby requiring a greater bandwidth from the channel circuitry.

Until recently, designers primarily used inductive heads to read data from these disk surfaces. Unfortunately, inductive heads are limited in the bandwidth at which they may function. Designers, accordingly, developed magnetoresistive (MR) heads which do not have the large inductance associated with previous heads. These MR heads, therefore, can accommodate higher data rates. Data is read from a disk surface by monitoring the changing resistivity of the MR head. The resistance of MR heads is a function of the strength of the magnetic field to which it is exposed. Since the resistance of the head varies with magnetic flux, the current through, or the voltage across the head is a function of the data written on the magnetic media.

This approach to reading information from the surface of a disk drive has proven to be very successful. However, as higher performance storage systems are developed, there is a continuing demand for greater bandwidth from the head and the read circuitry associated with the head. The ability to attain greater bandwidths is currently limited by the response of the MR head and the preamplifier used to generate read signals. However, these problems are not limited to preamplifiers used with disk drive systems. The problem is seen throughout the field of amplifiers. Amplifiers with greater bandwidth are desired.

Referring to FIG. 1, the traditional circuit for implementing programmable poles and zeros in preamplifiers usually uses a series of MOSFET circuits which is illustrated as MOSFET switches 102–116, which are MOSFETS acting as switches, connected in series with capacitors 132 to 146 respectively. FIG. 1 illustrates a zero circuit 150 and a pole circuit 162. The pole circuit 162 is connected to load resistors 160 and 162 while the zero circuit 150 is connected to the degeneration resistor 164. The circuit of FIG. 1 works adequately for low frequencies, however problems develop for preamplifiers having a frequency of 2 Gb per second and requiring a bandwidth in excess of 1 GHz with programmable poles ranging from several hundred MHz to over 1 GHz and zeros ranging from several hundred MHz to over 2 GHz. The parasitics of the switches 102–116 dramatically limit the performance of the programmable poles and zeros at the higher frequencies. More specifically, the size the MOSFET switches 102–116 are conflicting with respect to the characteristic trying to be emphasized. In the on state, the characteristic desired from these MOSFET switches is low on resistance by making these MOSFET switches larger. While in the off state the characteristic desired from these MOSFET switches is low parasitic capacitance by making these MOSFET switches smaller. These two desired characteristics are in conflict. These characteristics include unintended peaking or roll off. More particularly, sizing of the gate width is important depending on whether the switch is either in the on or off state. In the on state, when the switch is activated to connect the voltage $V_{cc}$ with the capacitor C132 to 146 to the AC ground, it is desirable that the width of the MOSFET switch 102–116 be large to reduce the on resistance of the specific MOSFET so that the capacitor 132–146 can be effective and produce the desired amplitude of peaking (zeros) or roll off (poles). Furthermore, when the MOSFETs 102–116 are in the off state, the switches 102–116 isolate the non-amplifier side of the capacitor from AC ground by the high impedance of switches 102–116, the width of the MOSFET drain of the switch should be small to reduce the parasitic capacitance of the MOSFET. The small parasitic capacitance is desired so that the unintended peaking or the roll off does not occur. It is illustrated that the MOSFET switch and more particularly the drain to source is in the current path of the above described capacitors.

As can be appreciated from the above discussion, no single MOSFET switch size can produce both satisfactory peaking or roll off amplitude when the MOSFET switch is on and satisfactory absence of unintended peaking or roll off when the MOSFET switch is off. Therefore, the MOSFET switch in the current path with the capacitor is not a feasible method of implementing programmable poles and zeros in preamplifiers as it introduces parasitic capacitance at the drain and prevents the preamplifier from achieving the required performance, especially at high frequencies.

SUMMARY OF THE INVENTION

The present invention eliminates a switch with high parasitic capacitance in the current path with the capacitor between the amplifier and AC ground. The present invention uses a variable impedance device with variable impedance which is controlled by a current source to set the impedance.

DETAILED DESCRIPTION OF THE DRAWINGS

The following invention is described with reference to figures in which similar or the same numbers represent the same or similar elements. While the invention is described in terms for achieving the invention's objectives, it can be appreciated by those skilled in the art that variations may be accomplished in view of these teachings without deviation from the spirit or scope of the invention.

Figure 7:
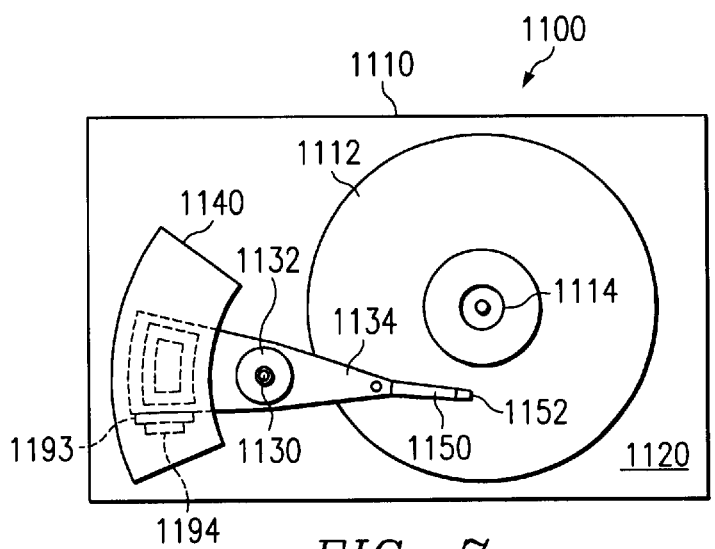
FIG. 7 is a top view of the disk drive system of the present invention.
Figure 6:
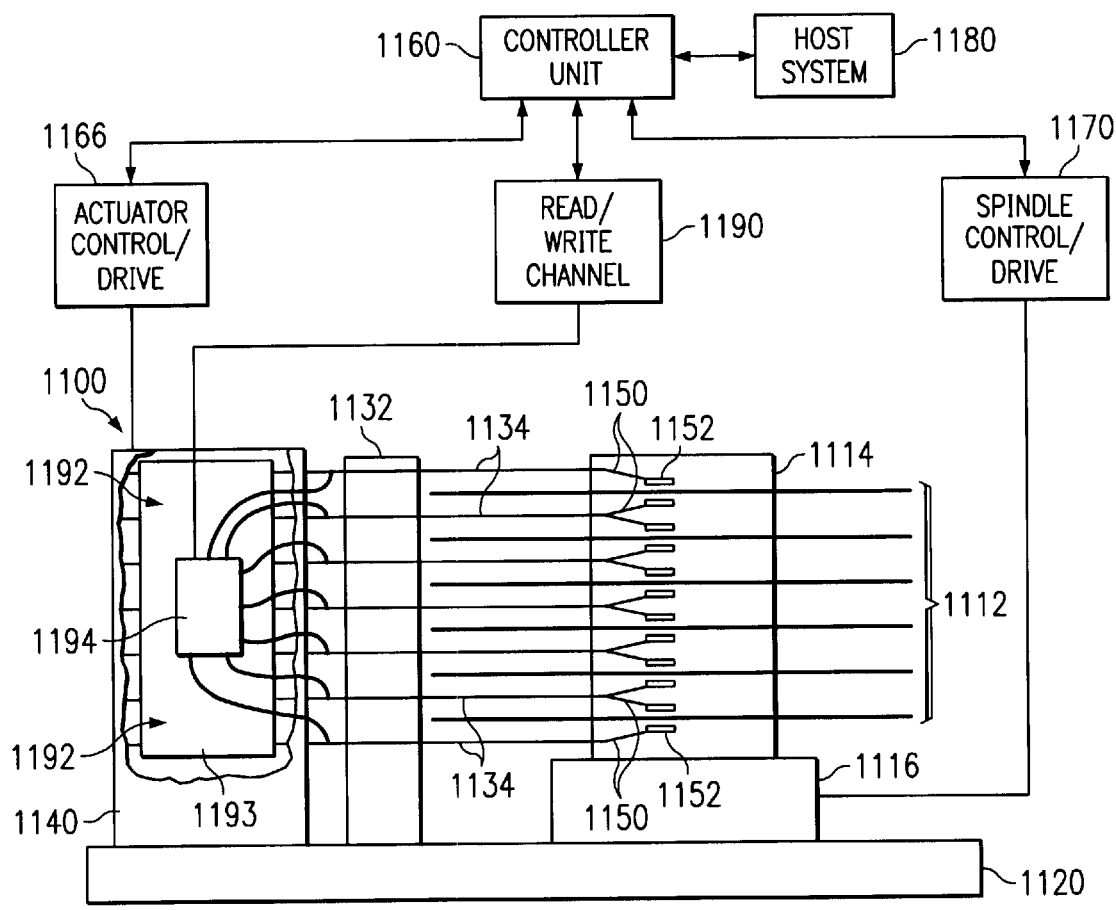
FIG. 6 is a side view of the disk drive system of the present invention.

FIGS. 6 and 7 show a side and top view, respectively, of the disk drive system designated by the general reference 1100 within an enclosure 1110. The disk drive system 1100 includes a plurality of stacked magnetic recording disks 1112 mounted to a spindle 1114. The disks 1112 may be conventional particulate or thin film recording disk or, in other embodiments, they may be liquid-bearing disks. The spindle 1114 is attached to a spindle motor 1116 which rotates the spindle 1114 and disks 1112. A chassis 1120 is connected to the enclosure 1110, providing stable mechanical support for the disk drive system. The spindle motor 1116 and the actuator shaft 1130 are attached to the chassis 1120. A hub assembly 1132 rotates about the actuator shaft 1130 and supports a plurality of actuator arms 1134. The stack of actuator arms 1134 is sometimes referred to as a "comb." A rotary voice coil motor 1140 is attached to chassis 1120 and to a rear portion of the actuator arms 1134.

A plurality of head suspension assemblies 1150 are attached to the actuator arms 1134. A plurality of inductive transducer heads 1152 are attached respectively to the suspension assemblies 1150, each head 1152 including at least one inductive write element. In addition thereto, each head 1152 may also include an inductive read element or a MR (magneto-resistive) read element. The heads 1152 are positioned proximate to the disks 1112 by the suspension assemblies 1150 so that during operation, the heads are in electromagnetic communication with the disks 1112. The rotary voice coil motor 1140 rotates the actuator arms 1134 about the actuator shaft 1130 in order to move the head suspension assemblies 1150 to the desired radial position on disks 1112.

A controller unit 1160 provides overall control to the disk drive system 1100, including rotation control of the disks 1112 and position control of the heads 1152. The controller unit 1160 typically includes (not shown) a central processing unit (CPU), a memory unit and other digital circuitry, although it should be apparent that these aspects could also be enabled as hardware logic by one skilled in the computer arts. Controller unit 1160 is connected to the actuator control/drive unit 1166 which is in turn connected to the rotary voice coil motor 1140. A host system 1180, typically a computer system or personal computer (PC), is connected to the controller unit 1160. The host system 1180 may send digital data to the controller unit 1160 to be stored on the disks, or it may request that digital data at a specified location be read from the disks 1112 and sent back to the host system 1180. A read/write channel 1190 is coupled to receive and condition read and write signals generated by the controller unit 1160 and communicate them to an arm electronics (AE) unit shown generally at 1192 through a cut-away portion of the voice coil motor 1140. The AE unit 1192 includes a printed circuit board 1193, or a flexible carrier, mounted on the actuator arms 1134 or in close proximity thereto, and an AE module 1194 mounted on the printed circuit board 1193 or carrier that comprises circuitry preferably implemented in an integrated circuit (IC) chip including read drivers, write drivers, and associated control circuitry. The AE module 1194 is coupled via connections in the printed circuit board to the read/write channel 1190 and also to each read head and each write head in the plurality of heads 1152. The AE module 1194 includes the preamp circuit of the present invention.

Figure 2:
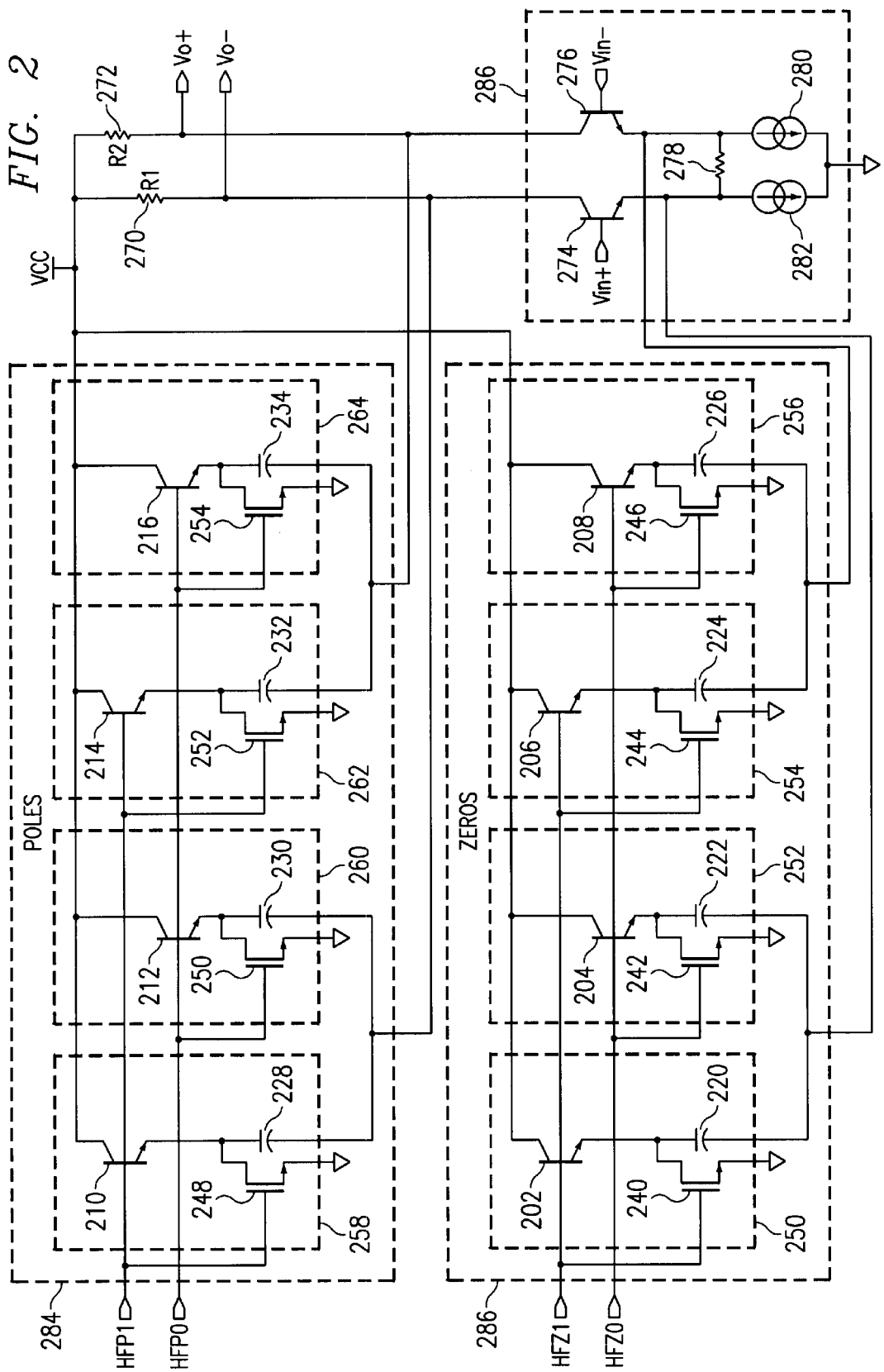
FIG. 2 illustrates a poles and zero circuit of the present invention.

Turning now to FIG. 2, zero circuit 286 is connected between load resistor 270 and load resistor 272 at a common voltage $V_{CC}$ and connected between transistor 274 and transistor 276 and resistor 278 of amplifier 286. Additionally, pole circuit 284 is connected between load resistors 270 and 272. The zero circuit 286 includes programmable zero circuit 250, programmable zero circuit 252, programmable zero circuit 254, and programmable zero circuit 256. Each of these programmable zero circuits (250–256) are operable to change the location of the zero in the frequency domain. Programmable zero circuit 250 and programmable zero circuit 252 are connected to one end of load resistors 270 and load resistor 272. The other end of programmable zero circuit 250 and programmable zero circuit 252 are connected between transistor 274, current source 282 and one end of degeneration resistor 278 to increase linearity. Additionally, programmable zero circuit 254 and programmable zero circuit 256 are connected to load resistor 270 and load resistor 272. The other end of programmable zero circuit 254 and programmable zero circuit 256 are connected between transistor 276, current source 280 and other end of resistor 278. Programmable pole circuit 258 and programmable pole circuit 260 are connected to load resistor 270 and load resistor 272. The other end of programmable pole circuit 258 and programmable pole circuit 260 are connected between transistor 274 and load resistor 270. Programmable pole circuit 262 and programmable pole circuit 264 are connected to load resistor 270 and load resistor 272. The other end of programmable pole circuit 262 and programmable pole circuit 264 is connected between load resistor 272 and transistor 276. The programmable zero circuit 250 includes bipolar transistor 202 having a collector connected to voltage $V_{cc}$ and to load resistors 270 and 272. The base of transistor 202 is connected to receive a control signal and the emitter of transistor 202 is connected to one end of capacitor 220. N-type field effect transistor NFET 240 has a gate connected to receive the control signal and is connected to the base of transistor 202. The drain of NFET 240 is connected to the emitter of transistor 202 and source of NFET 240 is connected to ground. The control signal is input both to the base of transistor 202 and the gate of NFET 240 and, when high, causes NFET 240 to turn on and to operate as a current source by operating in the triode region. The current source causes transistor 202 to operate as a low impedance device and capacitor 220 is made effective in a current path between transistor 202 and one side of degeneration load resistor 278. By connecting capacitor 220 and 222 to degeneration load resister 278, the frequency characteristics are changed. More specific, a zero is created that correspond to the capacitance of capacitor 220 and 222. Each of the programmable zero circuit 252, programmable zero circuit 254, and programmable zero circuit 256 operate in a similar fashion. By selecting or/and deselecting these programmable zero circuits the frequency response of amplifier 286 is altered.

Programmable zero circuit 252 includes transistor 204 having a collector connected to the load resistors 270 and 272. The emitter of transistor 204 is connected to capacitor 222. The other end of capacitor 222 is connected to capacitor 220 and connected between current source 282 and transistor 274. The emitter of transistor 204 is connected to the drain of NFET 242. The source of NFET 242 is connected to ground, and the gate of NFET 242 is connected to the base of transistor 204 to receive the control signal HFZ0.

The programmable zero circuit 254 includes transistor 206 with the collector of transistor 206 connected to load resistors 270 and 272, and the emitter of transistor 206 is connected both to the drain on NFET 244 and to the capacitor of 224. The source of NFET 244 is connected to ground. The gate of NFET 244 is connected to the base of transistor 206 and the gate of transistor 244 and the base of transistor 206 receives the control signal HFZ1. The gate of NFET 244 and the base of transistor 206 are connected to the base of transistor 202 and the gate of NFET 240.

Programmable zero circuit 256 includes transistor 208; the collector of transistor 208 is connected between the load resistors 270 and 272. The emitter of transistor 208 is connected to the capacitor 226 and is connected to the drain of NFET 246. The gate of NFET 246 is connected to the base of transistor 208 receives the signal HFZO. The gate of NFET 246 and the base of transistor 208 are connected to the base of transistor 204 as well as the gate of NFET 242.

The pole circuit 284 includes programmable pole circuit 258, programmable pole circuit 260, programmable pole circuit 262, and programmable pole circuit 264. The programmable pole circuit 258 includes transistor 210 having a collector of transistor 210 connected to one end of load resistor 270 and load resistor 272 and the other end of load resistor 270. Load resistors 270 and 272 and the collector of transistor 210 are connected to voltage $V_{CC}$. The emitter of transistor 210 is connected to capacitor 228, and the drain of NFET 248 is connected to the emitter of transistor 210. The source of NFET 248 is connected to ground. The gate of NFET 248 is connected to the base of transistor 210 and both the base of transistor 210, and the transistor 210 the gate of NFET 248 are connected to receive the control signal HFP1. This control signal HFP1 selects the programmable pole circuit 258 by turning on NFET 248 to operate as a current source so that transistor 210 operates as a variable impedance device so that capacitor 228 is connected to one end of load resistor 270 to create a pole. The location of the pole is based on the capacitance of capacitor 228. The pole can be moved in frequency by operation of programmable pole circuit 258. Programmable pole circuit 260 includes transistor 212 having a collector of transistor 212 connected to load resistors 270 and 272; the emitter of transistor 212 is connected to capacitor 230 and the drain in NFET 250. The gate of NFET 250 and the base of transistor 212 are connected together to receive control signal HFP0. The capacitor 230 is connected to the emitter of transistor 212 and to the drain of NFET 250, and the other end of capacitor 230 is connected to one end of load resistor 270 and transistor 274 and capacitor 228.

The programmable pole circuit 262 includes transistor 214. The collector of transistor 214 is connected to one end of load resistor 270 and load resistor 272; the emitter of transistor 214 is connected to the drain of NFET 252 and to capacitor 232. The source of NFET 252 is connected to ground. The gate of transistor 252 is connected to the base of transistor 214 and to the base of transistor 210 and the gate of NFET 248.

The programmable pole circuit 264 includes a transistor 216 with a collector of transistor 216 connected to load resistor 270 and load resistor 272; the emitter of transistor 216 is connected to the drain of NFET 254 and the capacitor 234. The other end of capacitor 234 is connected to the other end of capacitor 232, which is connected between load resistor 272 and transistor 276. The programmable pole circuit 284 operates by sending a control signal HFP1 to the base of transistor 210 and the gate of NFET 248 as well as the base of transistor 214 and the gate of NFET 252. The NFET 248 and NFET 252 operate respectively as a current source to operate the transistor 210 and the transistor 214 respectively as the variable impedance device. The capacitor 228 is connected in parallel to load resistor 270 to create a first pole and the capacitor 232 is connected in parallel to the load resistor 272 to create a second pole. Assuming the first and second poles are desired to be moved in frequency, the control signal HFP0 is activated and received by the base of transistor 212 and transistor 216 and the gate of NFET 250 and the gate of NFET 254. As a consequence, capacitor 234 is placed in parallel with capacitor 232, and capacitor 230 is placed in parallel with capacitor 228. This effectively changes the location in frequency of the first and second pole since the effective capacitance results from capacitor 228 and 230 in parallel with load resistors 270 has been changed and consequently the first pole changes in location with respect to frequency. Additionally, the capacitance resulting from capacitors 232 and 234 in parallel with load resistor 272 changes and the second pole changes its location in frequency due to the parallel capacitance of capacitor 232 and capacitor 234.

The programmable zero circuit 286 operates in a similar fashion; a control signal HFZ1 is applied to the base of transistor 202 and the gate of NFET 240. Additionally, the control signal HFZ1 is applied to the base of transistor 206 and to the gate of NFET 244. The capacitance 220 is connected between the NFET 240 and transistor 202 on one side and the one end of resistor 278 and current source 282 in parallel with capacitor 222 to create a first zero. A second zero is created by capacitor 224 connected between the NFET 244 and transistor 206 on one end and the other end of resistor 278 and current source 280.

The first zero and the second zero are changed in position in the frequency domain by application of the control signal HFZ0 to the bases of transistor 204 and transistor 208 and to the gates of NFET 242 and the gate of NFET 246. Capacitor 226 is placed in parallel with capacitor 224 changing the effective capacitance, and capacitor 222 is placed in parallel with capacitor 220, again changing the effective capacitance. As a result, the first pole and second zero are changed in frequency. Additional programmable zero circuits and additional programmable poles circuits under the control of corresponding control signals can be added to add or reduce the number of capacitors in parallel to change the locations of the first and second pole and first and second zero.

The amplifier circuit 286 includes transistor 274 connected with a collector to load resistor 270 and with the emitter of transistor 274 is connected to current source 282 and resistor 278. Additionally, transistor 276 has a collector connected to load resistor 272 and an emitter of transistor 276 is connected to resistor 278 and connected to current source 280. The other end of current source 282 and current source 280 is connected to ground.

The output of the amplifier 286 is connected to the collector of transistor 274 and the collector of transistor 276.

One advantage of the present invention is that current source 240, current source 242, current source 244, current source 246, current source 248, current source 250, current source 252, and current source 254 can be made by small NMOS devices. The emitter of each transistor or bipolar device 202, 204, 206, 208, 210, 212, 214 and 216 provides a low impedance on the non-amplifier side of capacitors 220, 222, 224, 226, 228, 230, 232, and 234 when the current sources are turned on. This allows the capacitors to be effective without being hampered or affected by the drain to source resistance of the NFET and produce the amplitude of peaking or roll off desired. The impedance seen by emitter of each transistor is related to the emitter current by $R_e = V_t/I_e$ where $V_T$ is the thermal voltage approximately 26 mV and $I_e$ is the emitter current. The impedance is variable by changing the current $I_e$. Thus, when the current source is turned off, the emitter provides very high impedance which eliminates the effect of the capacitor on the respective poles and zeros. The circuit as illustrated in FIG. 2 provides low impedance in the on state and very small parasitic capacitance in the off state to allow the amplifier 286 to operate with higher speeds.

Figure 1:
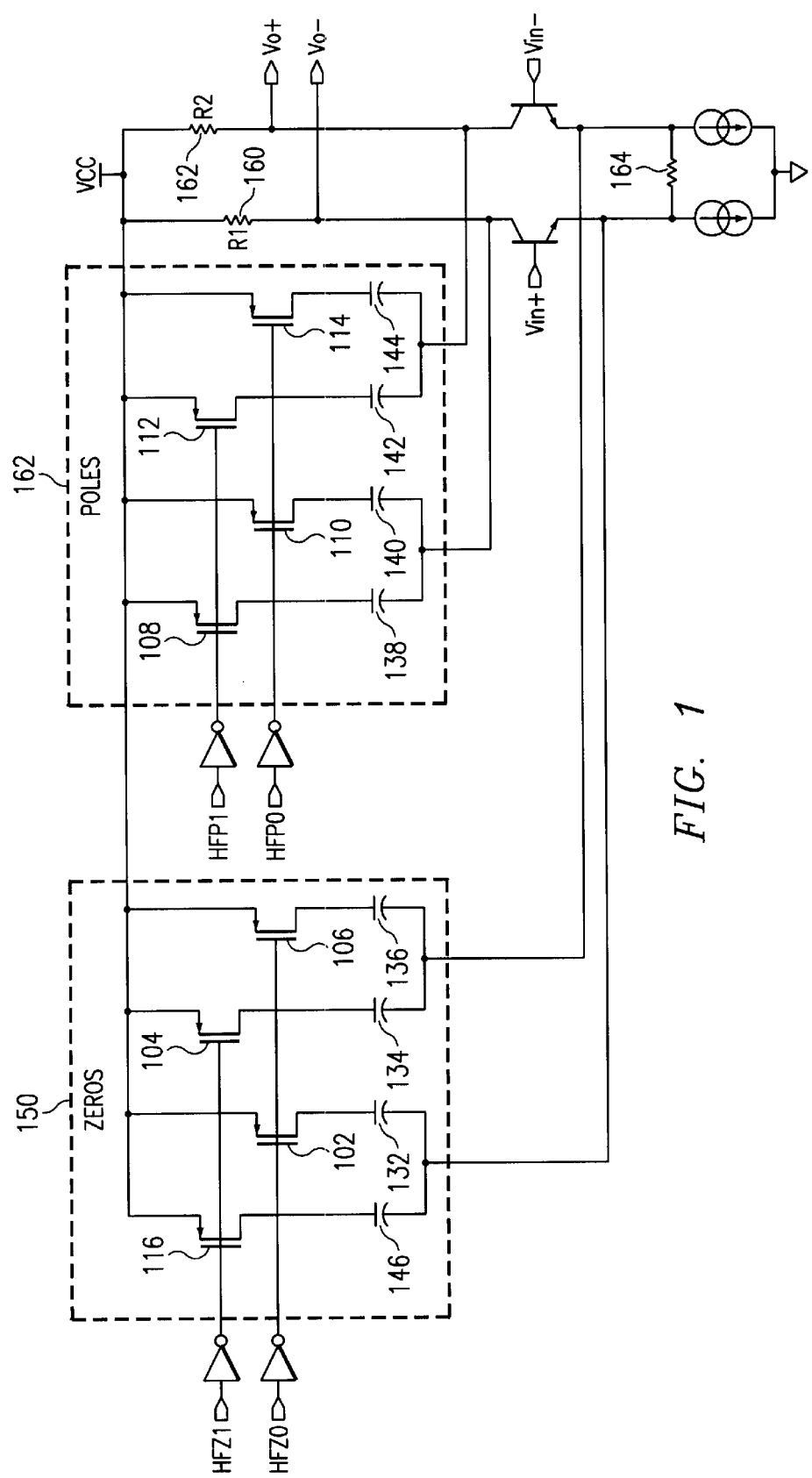
FIG. 1 illustrates a poles and zeros circuit.
Figure 3:
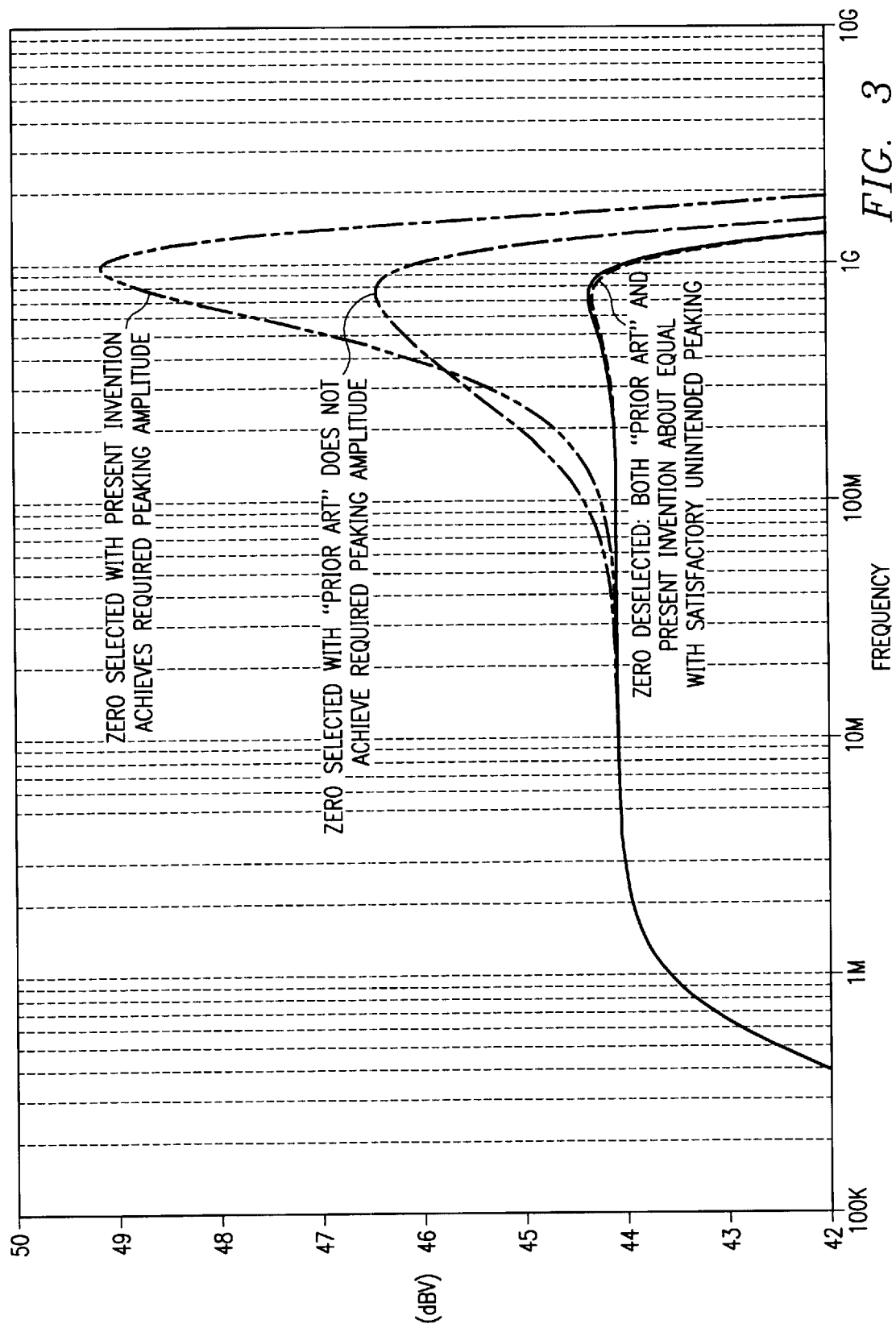
FIG. 3 illustrates a comparison of frequency response between the present invention and a circuit of the prior art.
Figure 4:
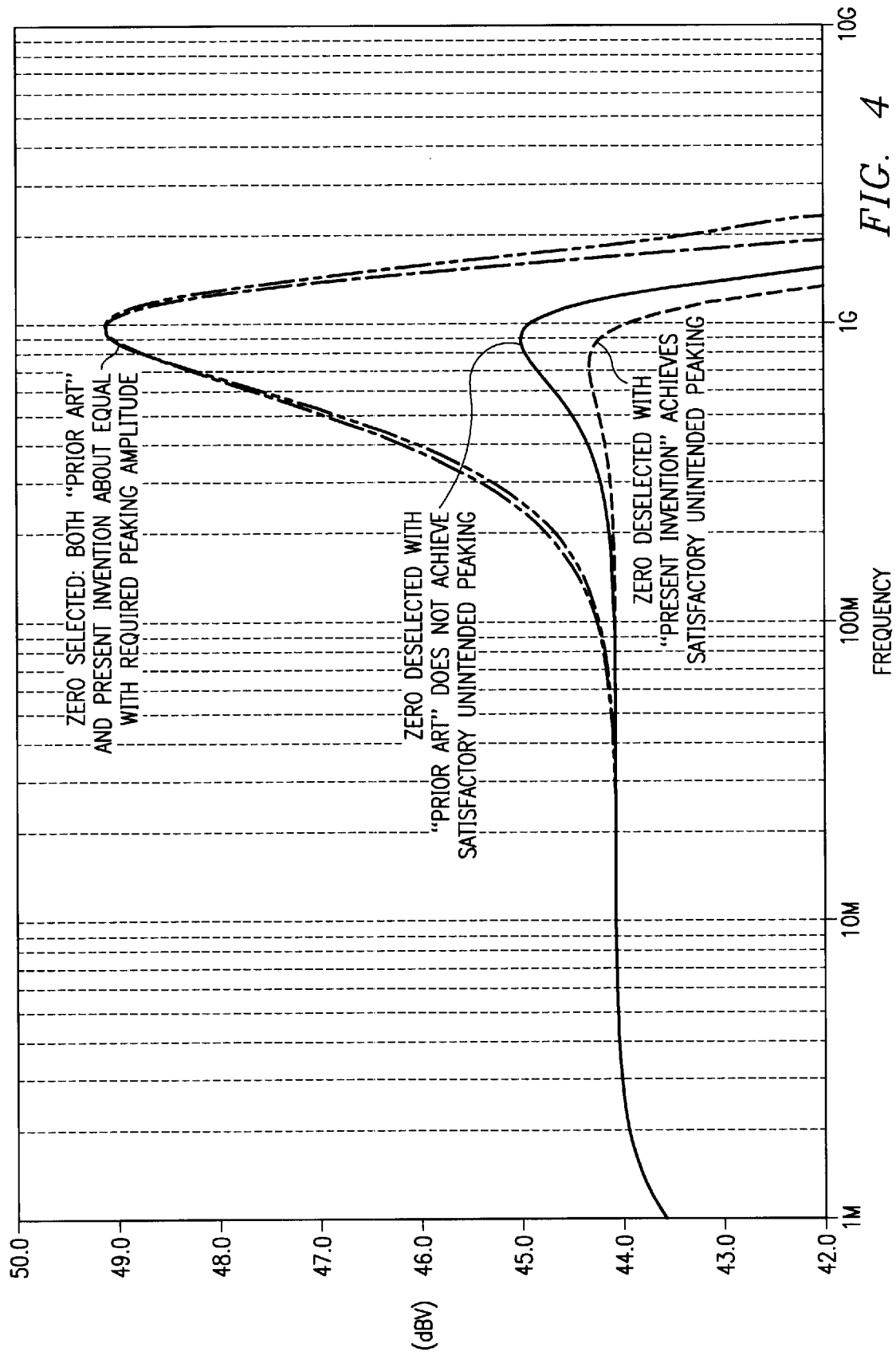
FIG. 4 illustrates a comparison of the present invention with frequency with the circuit of the prior art.

FIGS. 3 and 4 show the simulation results of the frequency response with a zero selected to change the frequency response and de-selected to restore the frequency response, by comparing the MOSFET switch in the current path as illustrated in FIG. 1 with the transistor circuit with the current source as illustrated in FIG. 2. With the present invention, using programmable zero circuit 250 as an illustration, the NFET 240 and the capacitor 220 are connected in parallel and consequently are in different current paths. The current path formed by the transistor 202 and the NFET 240 is different from the current path formed by transistor 202 and capacitor 220. The NFET 240 is not in series with capacitor 220.

Both FIGS. 3 and 4 show approximately the same required peaking amplitude for the present invention when zero is selected and has satisfactory unintended peaking when zero is de-selected. In FIG. 3, the MOSFET devices of the prior art are sized small to match the unintended peaking of the present invention when zero is deselected. While this unintended peaking of FIG. 1 is acceptable, the peaking when the zero is selected does not achieve the desired amplitude.

In FIG. 4, the MOSFET devices of FIG. 1 were sized large to match the desired peaking amplitudes of the present invention when zero is selected. While this peaking of the circuit of FIG. 1 achieves the required magnitude, the unintended peaking when zero is deselected is significantly higher than with the circuit of FIG. 2 of the present invention and is not satisfactory for desired performance. Thus unlike the present invention, the circuit of FIG. 1 cannot achieve the required performance as no single MOSFET switch of FIG. 1 size can produce both satisfactory peaking amplitude while zero is selected and satisfactory unintended peaking when the zero is deselected.

The operation of FIG. 2 is that each programmable pole circuit or programmable zero circuit is selected/deselected through a digital signal line to carry signal HFZ1, signal HFZ0, signal HFP1, and signal HFP0 to connect the base of a respective NPN device and the gate of NFET current source device. When the bit is selected (goes high) the corresponding NPN base and NMOS region gate are pulled to VCC, 5 volts. These 5 volts across the NMOS gate source region turns the NMOS on in a triode region and behaves like a resistor with a value equal to Ron of NMOS device. The NMOS then acts like a current source for the transistor NPN since it has the $V_{CC}$-$V_{be}$-GND, which is approximately 4.3 volts applied across it, and the NPN provides a low impedance. When the bit is deselected, the corresponding NPN base NMOS gate is pulled to ground. The NMOS turns off as 0 volts are applied across the gate to source region and thus no current flows through the NMOS and NPN and the emitter of the NPN provides a high impedance. Variable impedance is achieved.

Figure 5:
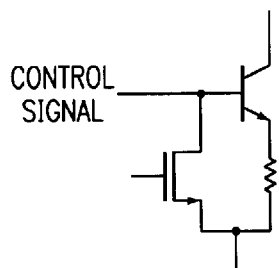
FIG. 5 illustrates a gain circuit of the present invention.

FIG. 5 illustrates one such circuit to regulate the programmable zero or pole circuit.

One of ordinary skill in the art would know that the programmable poles and zeros can be used for programmable gain by replacing capacitors 220 to 226, and/or capacitor 228 to capacitor 232 as illustrated in FIG. 2 with resistors. For programmable gain, a low MOSFET on resistance is required when a programmable gain circuit is selected because the overall series resistance (switch plus resistor) put in parallel with either load resistor 270 or load resistor 272 or resistor 278 needs to be dominated by the selected resistor (not the switch) for good matching and gain accuracy. When the gain circuit is deselected, a low parasitic capacitance is required to prevent a reduction (or increase) in gain at high frequency caused by the deselected resistor being unintentionally put in parallel with load resistor 270 or load resistor 272 or resistor 278 by the low impedance of the parasitic capacitance at high frequencies. As with programmable poles and zeros these problems in the programmable gain can be overcome by using the circuit of the present invention.

What is claimed is:

1. A pole and zero circuit for changing the position of a pole or a zero of an amplifier; comprising
   a capacitor to change the position of said pole and zero for said amplifier;
   a first current path for said capacitor;
   a variable impedance device in said first current path to connect said capacitor to said amplifier;
   a current source to control the impedance of said variable impedance device.

2. A pole and zero circuit for changing the position of a pole or a zero of an amplifier as in claim 1, wherein said current source is positioned in a second current path.

3. A pole and zero circuit for changing the position of a pole or a zero of and amplifier as in claim 1, wherein said current source is parallel to said capacitor.

4. A pole and zero circuit for changing the position of a pole or a zero of an amplifier as in claim 1, wherein said variable impedance device is a transistor.

5. A pole and zero circuit for changing the position of a pole or a zero of an amplifier as in claim 1, wherein said current source is connected to an emitter of said transistor.

6. A pole or zero circuit for changing the position of a pole or a zero of an amplifier as in claim 1, wherein said current source is a FET.

7. A pole or zero circuit for changing the position of a pole or a zero of an amplifier as in claim 6, wherein said FET is a NFET.

8. A pole or zero circuit for changing the position of a pole or a zero of an amplifier as in claim 4, wherein said transistor is a NPN transistor.

9. A system for reading information from a disk, comprising;
   a preamplifier circuit having an amplifier for amplifying said information on said disk;
   a read channel for conditioning said information read from disk;
   a capacitor to change the position of a pole or and zero for said amplifier,
   a first current path for said capacitor;
   a variable impedance device in said first current path to connect said capacitor to said amplifier;
   a current source to control the impedance of said variable impedance device.

10. A system for reading information from a disk, as in claim 9, wherein said current source is positioned in the second current path.

11. A system for reading information from a disk, as in claim 9, wherein said current source is parallel to said capacitor.

12. A system for reading information from a disk, as in claim 9, wherein said variable impedance device is a transistor.

13. A system for reading information from a disk, as in claim 12, wherein said current source is connected to an emitter of said transistor.

14. A system for reading information from a disk, as in claim 9, wherein said current source is a FET.

15. A system for reading information from a disk, as in claim 14, wherein said FET is a NFET.

16. A system for reading information from a disk, as in claim 12, wherein said transistor is a NPN transistor.

* * * * *